(12) United States Patent
Kim

(10) Patent No.: US 12,617,266 B2
(45) Date of Patent: May 5, 2026

(54) THERMAL MANAGEMENT SYSTEM FOR MOBILITY VEHICLE

(71) Applicants: Hyundai Motor Company, Seoul (KR); Kia Corporation, Seoul (KR)

(72) Inventor: Jong Won Kim, Cheonan-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 350 days.

(21) Appl. No.: 18/301,553

(22) Filed: Apr. 17, 2023

(65) Prior Publication Data

US 2024/0174073 A1 May 30, 2024

(30) Foreign Application Priority Data

Nov. 29, 2022 (KR) ......................... 10-2022-0162853

(51) Int. Cl.

| | |
|---|---|
| *B60K 11/04* | (2006.01) |
| *B60L 58/26* | (2019.01) |
| *H01M 10/613* | (2014.01) |
| *H01M 10/625* | (2014.01) |
| *H01M 10/63* | (2014.01) |
| *H01M 10/6569* | (2014.01) |
| *H01M 10/663* | (2014.01) |

(Continued)

(52) U.S. Cl.

CPC .............. *B60K 11/04* (2013.01); *B60L 58/26* (2019.02); *H01M 10/613* (2015.04); *H01M 10/625* (2015.04); *H01M 10/63* (2015.04); *H01M 10/6569* (2015.04); *H01M 10/663* (2015.04); *H02P 29/60* (2016.02); *H05K*

*7/20872* (2013.01); *B60L 2200/24* (2013.01); *H01M 2220/20* (2013.01)

(58) Field of Classification Search

CPC ... B60K 11/04; H01M 10/613; H01M 10/625; H01M 10/63; H01M 10/6569; H01M 10/663; H01M 2220/20; H02P 29/60; B60L 58/26; B60L 2200/24; H05K 7/20872

USPC ......................................................... 701/22

See application file for complete search history.

(56) References Cited

U.S. PATENT DOCUMENTS

| | | |
|---|---|---|
| 2017/0187081 A1 | 6/2017 | Kim et al. |
| 2018/0083509 A1* | 3/2018 | Yang .................... H01M 10/625 |
| 2019/0070924 A1* | 3/2019 | Mancini ............. B60H 1/32281 |

(Continued)

FOREIGN PATENT DOCUMENTS

KR 20150059247 A 6/2015

*Primary Examiner* — Gertrude Arthur Jeanglaude
(74) *Attorney, Agent, or Firm* — Slater Matsil, LLP

(57) ABSTRACT

An embodiment thermal management system for a mobility vehicle includes a first coolant line including a battery, a second coolant line including an electrical component including an oil cooler configured to cool a drive motor, a heat exchanger connected to the first coolant line and the second coolant line, wherein the heat exchanger is configured to allow a coolant in the first coolant line to exchange heat with the coolant in the second coolant line, and a controller configured to adjust a temperature of the battery as the coolant in the second coolant line is heated by the oil cooler by allowing the drive motor to generate heat by applying a preset electric current to the drive motor and as the coolant in the first coolant line is heated by heat exchange in the heat exchanger when the battery is required to be heated.

20 Claims, 4 Drawing Sheets

(51) Int. Cl.
  *H02P 29/60*    (2016.01)
  *H05K 7/20*     (2006.01)

(56)      References Cited

U.S. PATENT DOCUMENTS

| | | | |
|---|---|---|---|
| 2022/0355645 A1* | 11/2022 | Jeong | B60H 1/00664 |
| 2023/0415593 A1* | 12/2023 | Lee | H01M 10/615 |
| 2025/0031345 A1* | 1/2025 | Chae | H01M 10/663 |

* cited by examiner

FIG. 4

THERMAL MANAGEMENT SYSTEM FOR MOBILITY VEHICLE

CROSS-REFERENCE TO RELATED APPLICATIONS

This application claims the benefit of Korean Patent Application No. 10-2022-0162853, filed on Nov. 29, 2022, which application is hereby incorporated herein by this reference.

TECHNICAL FIELD

The present invention relates to a thermal management system for a mobility vehicle.

BACKGROUND

Recently, a lithium polymer battery (LiPB), which is a next-generation secondary battery, is in the limelight as a battery used for an environmental-friendly vehicle such as an electric vehicle or a hybrid vehicle.

The lithium polymer battery is a secondary battery that uses a solid electrolyte having excellent ionic conductance. A liquid electrolyte battery has a risk of a leak of an electrolyte and has a problem in that an organic solvent used for the electrolyte is a flammable material. In contrast, the solid electrolyte battery, such as the lithium polymer battery, is advantageous in that a likelihood of a leak of an electrolyte, a risk of explosion, and internal resistance are low, energy density is high, and a lifespan does not deteriorate, even though the solid electrolyte battery is not fully charged and/or discharged, because there is no memory effect.

However, in a low-temperature region, the internal resistance of the battery rapidly increases as a state of charge (SOC) decreases, which causes a problem in that a discharge output deteriorates.

That is, a traveling condition of a mobility vehicle is determined depending on a temperature of the battery and an output in accordance with the SOC. Therefore, it is necessary to raise a temperature of the battery in a low-temperature state to an appropriate temperature to ensure power performance of the mobility vehicle at a low temperature.

In addition, in case that the battery in a low-temperature state is charged, overvoltages of positive and negative electrodes are asymmetrically increased. For this reason, a charge capacity is decreased in comparison with room-temperature charging, and the voltage of the negative electrode is inevitably decreased to a very low voltage.

In this case, metallic lithium is precipitated in the battery. In case that the above-mentioned process is repeated over a long period of time, there is a risk of degradation in performance of the battery and a risk of an internal short circuit.

As battery heating systems in the related art, there have been known a battery heating system that raises a temperature of a battery by heating a coolant, which circulates in a battery pack, by using a coolant heater, and a battery heating system that heats air at the periphery of a battery by using a heater assembly that surrounds a battery module.

In particular, in case that the coolant heater is applied, the coolant heater is applied as a PTC. For this reason, there is a problem in that electric power consumption increases, and there is a limitation in quickly adjusting a temperature of the coolant only by using the coolant heater. Further, the application of the coolant heater increases a weight and manufacturing costs.

The foregoing explained as the background is intended merely to aid in the understanding of the background of embodiments of the present invention and is not intended to mean that the present invention falls within the purview of the related art that is already known to those skilled in the art.

SUMMARY

The present invention relates to a thermal management system for a mobility vehicle. Particular embodiments relate to a thermal management system for a mobility vehicle, in which a coolant heater, which is a means for raising a temperature of a battery, is eliminated, and a temperature of the battery is adjusted by raising a temperature of a circulating coolant by heat generated from a drive motor.

Embodiments of the present invention can solve problems in the art and provide a thermal management system for a mobility vehicle, which is capable of adjusting a temperature of a battery even though a coolant heater is eliminated, reducing the time required to heat the battery, stably adjusting the temperature of the battery, and reducing manufacturing costs and a weight by using devices applied to an electric mobility vehicle.

An embodiment of the present invention provides a thermal management system for a mobility vehicle, the thermal management system including a first coolant line including a battery and configured to allow a coolant to circulate therethrough, a second coolant line including an electrical component including an oil cooler for cooling a drive motor, the second coolant line configured to allow the coolant to circulate therethrough, a heat exchanger connected to the first coolant line and the second coolant line and configured to allow the coolants to exchange heat with each other, and a controller configured to adjust a temperature of the battery as the coolant in the second coolant line is heated by the oil cooler by allowing the drive motor to generate heat by applying a preset electric current to the drive motor and as the coolant in the first coolant line is heated by heat exchange in the heat exchanger when the battery is required to be heated.

The preset electric current may have an electric current value that allows the drive motor to generate heat in a state in which the drive motor is restricted.

The controller may raise the temperature of the coolant in the first coolant line by applying the preset electric current to the drive motor until the temperature of the battery reaches an appropriate temperature.

A first water pump may be provided in the first coolant line, and a second water pump may be provided in a second coolant line.

The first coolant line may further include a first radiator, and the coolant may be divided by a first valve and selectively flow to the first radiator.

The second coolant line may further include a second radiator, and the coolant may be divided by a second valve and selectively flow to the second radiator.

The controller may cut off the application of the preset electric current for heating the battery when the temperature of the drive motor reaches a preset limit temperature.

The controller may identify a plan to charge the mobility vehicle when the mobility vehicle travels, and the controller may allow the drive motor to generate heat by applying the preset electric current to the drive motor before the mobility vehicle reaches a location at which the mobility vehicle is charged.

The drive motor may be provided as a plurality of drive motors, the oil coolers may be respectively provided in the drive motors, and the controller may allow the drive motor to generate heat by applying the preset electric current to the drive motor, which does not operate among the plurality of drive motors, in case that the mobility vehicle travels.

Meanwhile, an embodiment of the present invention provides a thermal management system for a mobility vehicle, the thermal management system including a refrigerant circuit including a compressor, a condenser, an expander, and an evaporator and configured to allow a refrigerant to circulate therethrough, a first coolant line including a battery and configured to allow a coolant to circulate therethrough, a second coolant line including an electrical component including an oil cooler for cooling a drive motor, the second coolant line being configured to allow the coolant to circulate therethrough, a heat exchanger connected to the refrigerant circuit, the first coolant line, and the second coolant line and configured to allow the refrigerant and the coolant to exchange heat with one another, and a controller configured to heat the coolant in the second coolant line by the oil cooler by allowing the drive motor to generate heat by applying a preset electric current to the drive motor and configured to raise a temperature of the battery by allowing the coolant in the second coolant line to exchange heat with the coolant in the first coolant line through the heat exchanger when the battery is required to be heated.

The refrigerant circuit may further include a branch line branching off from a front end of the evaporator so that the heat exchanger is provided in the branch line, and an additional expander may be provided at a front end of the heat exchanger.

The first coolant line may further include a first water pump and a first radiator, and the coolant may be divided by the first valve and selectively flow to the first radiator.

The second coolant line may further include a second water pump and a second radiator, and the coolant may be divided by the second valve and selectively flow to the second radiator.

When the battery is required to be heated, the controller may supply the high-temperature refrigerant, which passes through the condenser of the refrigerant circuit, to the heat exchanger, such that the coolant in the first coolant line is heated by exchanging heat with the refrigerant.

The thermal management system for a mobility vehicle, which is structured as described above, adjusts the temperature of the coolant, which circulates through the battery, by using the heat generated from the drive motor applied to the electric mobility vehicle.

Therefore, the temperature of the battery may be adjusted even though the coolant heater is eliminated. The time required to heat the battery may be reduced, the temperature of the battery may be stably adjusted, and the manufacturing costs and weight may be reduced because the devices applied to the electric mobility vehicle are used.

4

Figure 3:
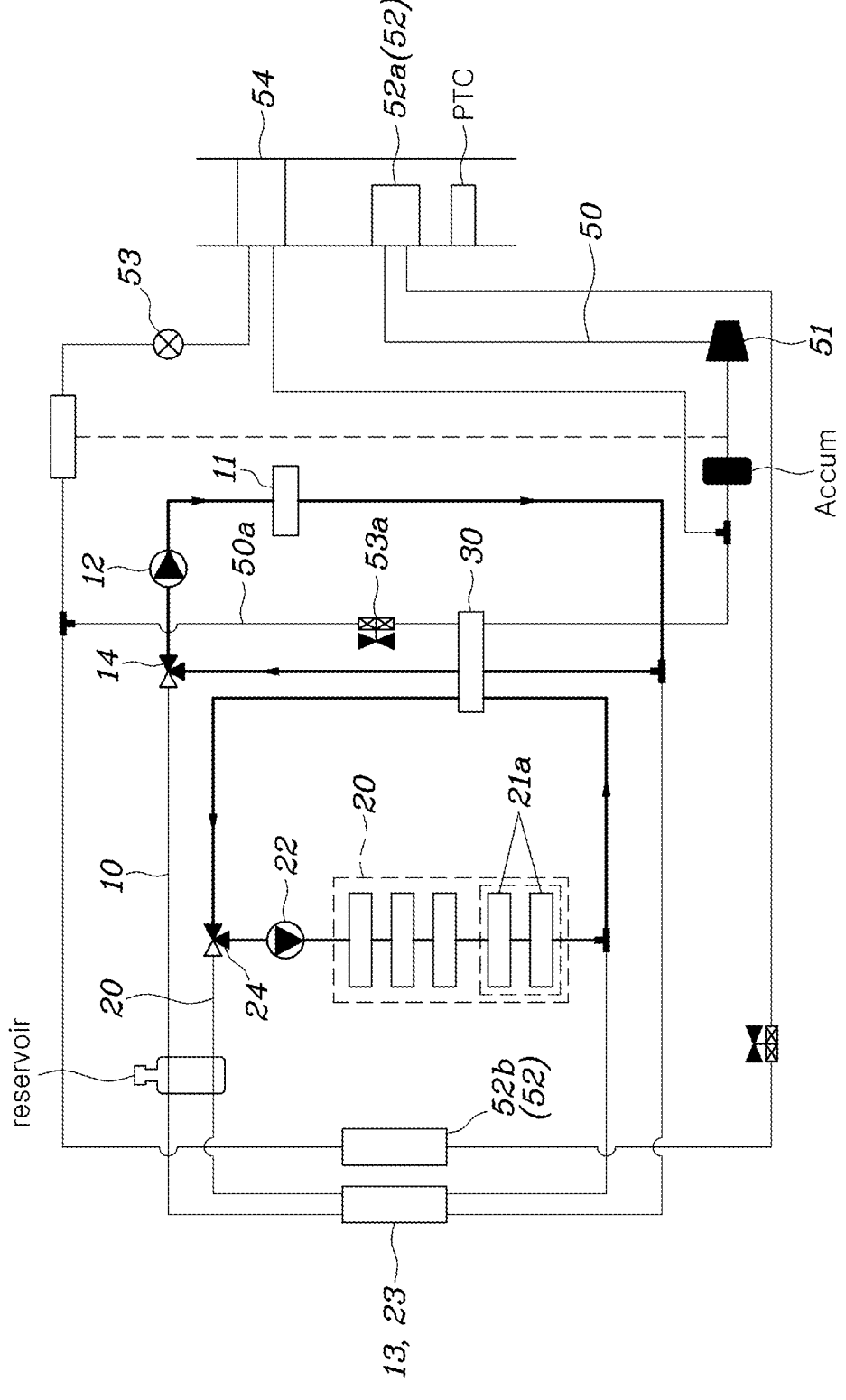
FIG. 3 is a circuit diagram of a thermal management system for a mobility vehicle according to embodiments of the present invention.
Figure 4:
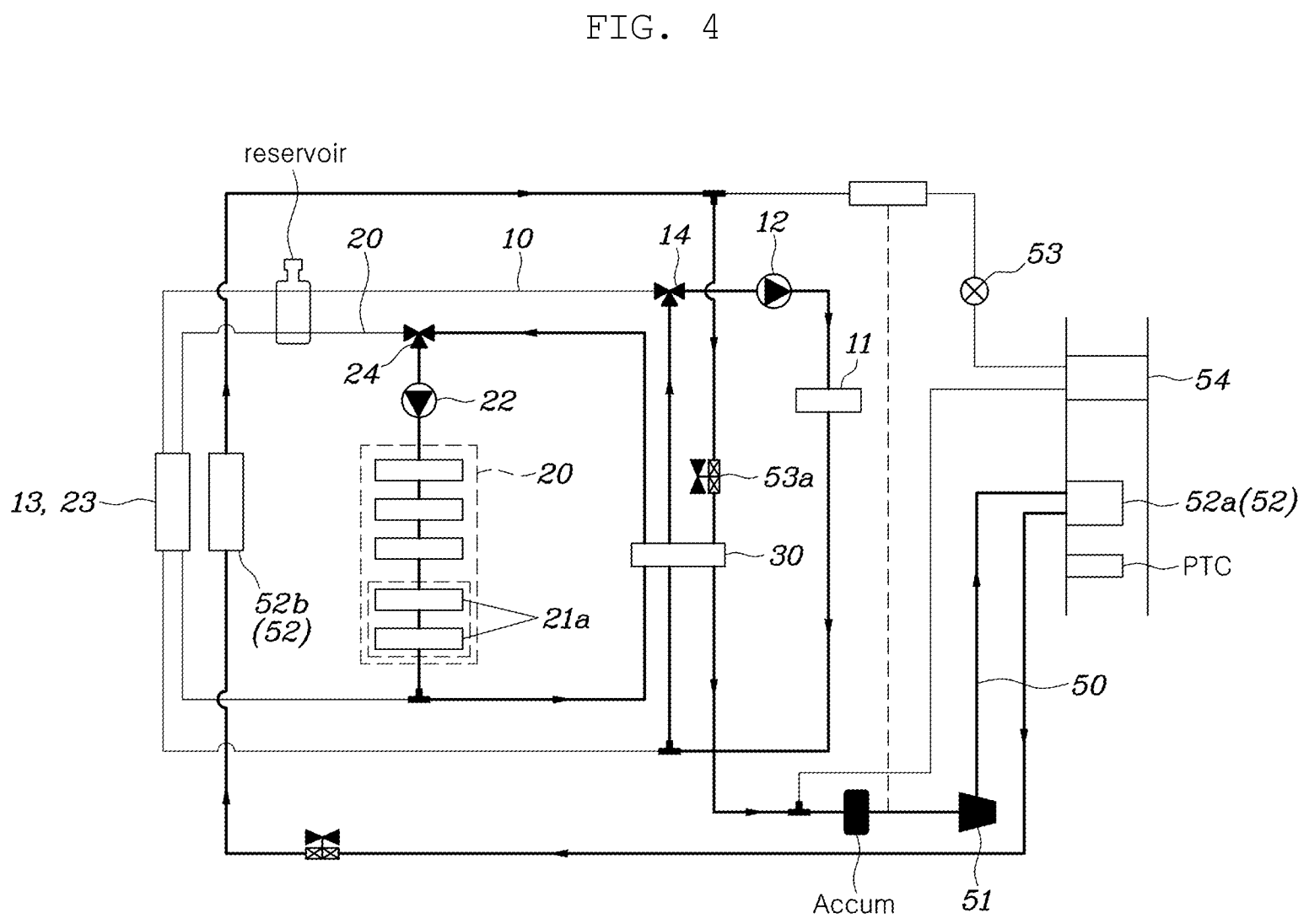

FIG. 4 is a view illustrating an embodiment of the thermal management system for a mobility vehicle illustrated in FIG. 3.

DETAILED DESCRIPTION OF ILLUSTRATIVE EMBODIMENTS

Hereinafter, embodiments disclosed in the present specification will be described in detail with reference to the accompanying drawings. The same or similar constituent elements are assigned with the same reference numerals regardless of reference numerals, and the repetitive description thereof will be omitted.

The suffixes "module," "unit", "part", and "portion" used to describe constituent elements in the following description are used together or interchangeably in order to facilitate the description, but the suffixes themselves do not have distinguishable meanings or functions.

In the description of the embodiments disclosed in the present specification, the specific descriptions of publicly known related technologies will be omitted when it is determined that the specific descriptions may obscure the subject matter of the embodiments disclosed in the present specification. In addition, it should be interpreted that the accompanying drawings are provided only to allow those skilled in the art to easily understand the embodiments disclosed in the present specification, and the technical spirit disclosed in the present specification is not limited by the accompanying drawings, and includes all alterations, equivalents, and alternatives that are included in the spirit and the technical scope of the present invention.

The terms including ordinal numbers such as "first," "second," and the like may be used to describe various constituent elements, but the constituent elements are not limited by the terms. These terms are used only to distinguish one constituent element from another constituent element.

When one constituent element is described as being "coupled" or "connected" to another constituent element, it should be understood that one constituent element can be coupled or connected directly to another constituent element, and an intervening constituent element can also be present between the constituent elements. When one constituent element is described as being "coupled directly to" or "connected directly to" another constituent element, it should be understood that no intervening constituent element is present between the constituent elements.

Singular expressions include plural expressions unless clearly described as different meanings in the context.

In the present specification, it should be understood the terms "comprises," "comprising," "includes," "including," "containing," "has," "having" or other variations thereof are inclusive and therefore specify the presence of stated features, integers, steps, operations, elements, components, or combinations thereof, but do not preclude the presence or addition of one or more other features, integers, steps, operations, elements, components, or combinations thereof.

A controller may include a communication device configured to communicate with another control unit or a sensor to control a corresponding function, a memory configured to store an operating system, a logic instruction, and input/output information, and one or more processors configured to perform determination, computation, decision, or the like required to control the corresponding function.

In this context, a mobility vehicle includes a motorized micromobility vehicle, a personal mobility device, a personal transporter, a powered transporter, an electric rideable, a personal light electric vehicle, or any compact device for transporting an individual. Examples include electric skateboards, kick scooters, self-balancing unicycles (e.g., Segways), motorized scooters or skateboards, electric bicycles, and electric motorbikes.

Hereinafter, a thermal management system for a mobility vehicle according to exemplary embodiments of the present invention will be described with reference to the accompanying drawings.

Figure 1:
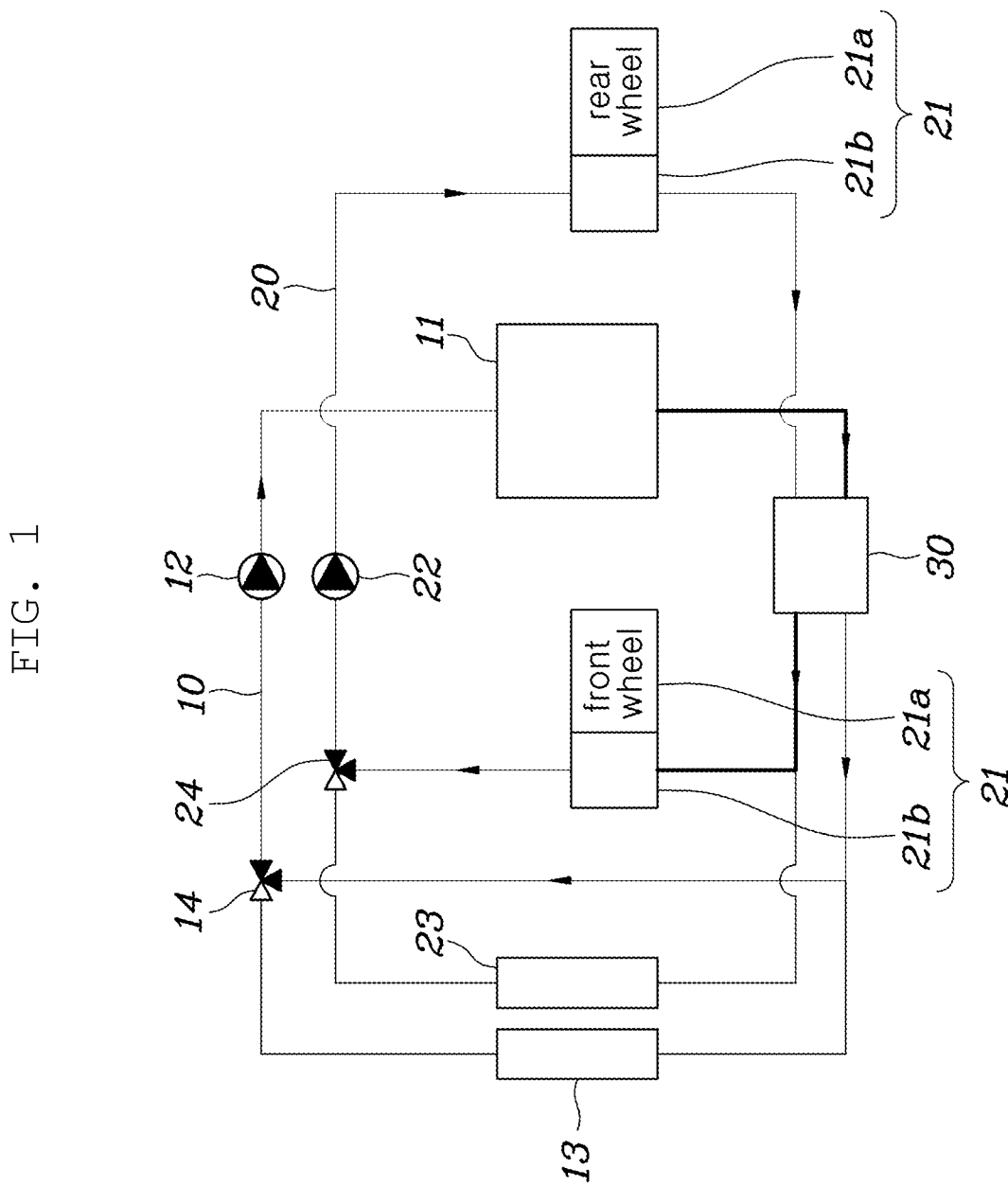
FIG. 1 is a circuit diagram of a thermal management system for a mobility vehicle according to embodiments of the present invention.
Figure 2:
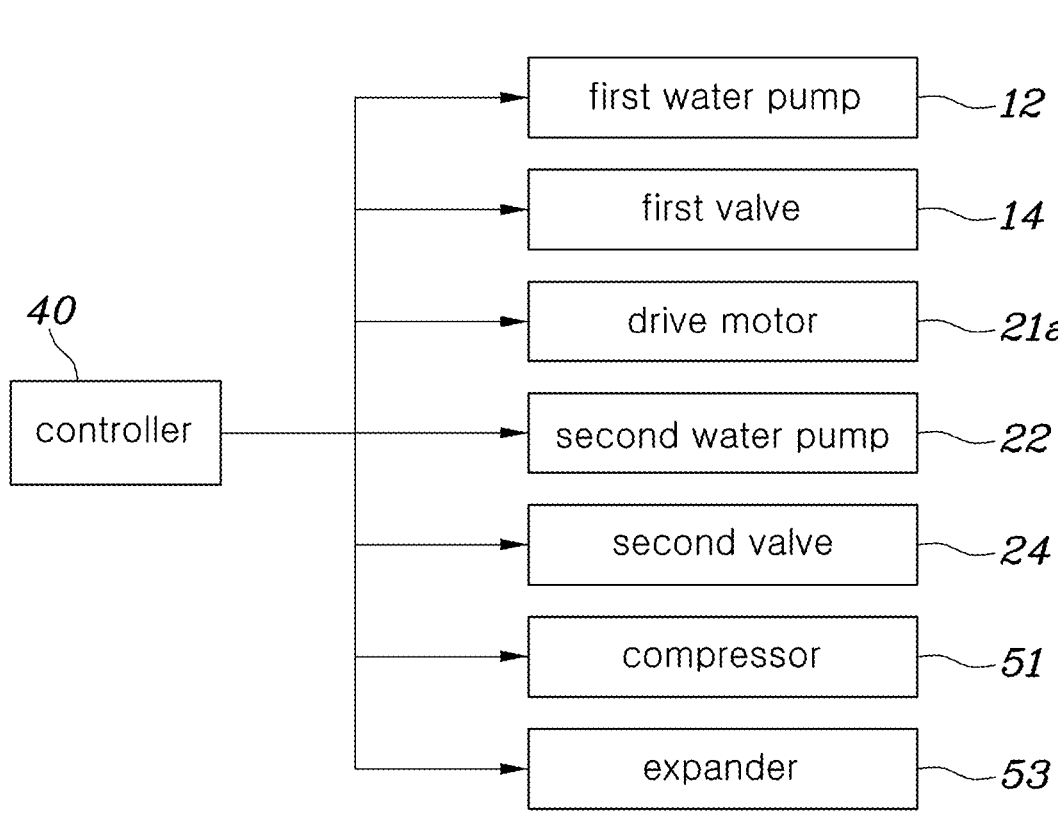
FIG. 2 is a configuration view of the thermal management system for a mobility vehicle illustrated in FIG. 1.

FIG. 1 is a circuit diagram of a thermal management system for a mobility vehicle according to embodiments of the present invention, FIG. 2 is a configuration view of the thermal management system for a mobility vehicle illustrated in FIG. 1, FIG. 3 is a circuit diagram of a thermal management system for a mobility vehicle according to embodiments of the present invention, and FIG. 4 is a view illustrating an embodiment of the thermal management system for a mobility vehicle illustrated in FIG. 3.

As illustrated in FIGS. 1 to 2, a thermal management system for a mobility vehicle according to embodiments of the present invention includes a first coolant line 10 including a battery 11 and configured to allow a coolant to circulate therethrough, a second coolant line 20 including an electrical component 21 including an oil cooler 21b for cooling a drive motor 21a, the second coolant line 20 being configured to allow the coolant to circulate therethrough, a heat exchanger 30 connected to the first coolant line 10 and the second coolant line 20 and configured to allow the coolants to exchange heat with each other, and a controller 40 configured to adjust a temperature of a battery 11 as the coolant in the second coolant line 20 is heated by the oil cooler 21b by allowing the drive motor 21a to generate heat by applying a preset electric current to the drive motor 21a and as the coolant in the first coolant line 10 is heated by heat exchange in the heat exchanger 30 when the battery 11 is required to be heated.

According to embodiments of the present invention, the first coolant line 10 and the second coolant line 20 are provided. The temperatures of the coolants circulating in the respective lines are managed as different temperatures. That is, the first coolant line 10 includes the battery 11, and the temperature of the coolant is adjusted by managing the temperature of the battery 11. The second coolant line 20 includes the electrical component 21, and the temperature of the coolant is adjusted by managing the temperature of the electrical component 21.

A first water pump 12 may be provided in the first coolant line 10, such that the coolant may be circulated in the first coolant line 10 by an operation of the first water pump 12. A second water pump 22 may be provided in the second coolant line 20, such that the coolant may be circulated in the second coolant line 20 by an operation of the second water pump 22.

In addition, the first coolant line 10 may further include a first radiator 13, and the coolant may be divided by a first valve 14 and selectively flow to the first radiator 13.

Therefore, the coolant circulating in the first coolant line 10 may selectively circulate through the heat exchanger 30 or the first radiator 13 depending on an opening/closing operation of the first valve 14. When the coolant circulates through the first radiator 13, the coolant and outside air exchange heat with each other, such that the temperature of the coolant may be adjusted.

In addition, the second coolant line may further include a second radiator 23, and the coolant may be divided by the second valve 24 and selectively flow to the second radiator 23.

Therefore, the coolant circulating in the second coolant line 20 may selectively circulate through the heat exchanger 30 or the second radiator 23 depending on an opening/closing operation of the second valve 24. When the coolant circulates through the second radiator 23, the coolant and outside air exchange heat with each other, such that the temperature of the coolant may be adjusted.

As described above, means for adjusting the temperatures of the coolants may be respectively provided in the coolant lines. The temperatures of the battery 11 and the electrical component 21 may be adjusted by adjusting the temperatures of the coolants.

Meanwhile, the first coolant line 10 and the second coolant line 20 are configured to allow the coolants to exchange heat with each other through the heat exchanger 30, such that the temperatures of the coolants circulating through the respective lines may be adjusted.

In particular, according to embodiments of the present invention, the coolant circulating in the first coolant line 10 and the coolant circulating in the second coolant line 20 may exchange heat with each other to heat the battery 11.

That is, the electrical component 21 according to embodiments of the present invention includes the oil cooler 21b configured to cool the drive motor 21a. The oil cooler 21b serves to remove heat generated from the drive motor 21a. The heat generated from the drive motor 21a exchanges heat with the coolant circulating in the second coolant line 20, such that the drive motor 21a is cooled, and the temperature of the coolant is raised. The electrical component 21 may further include an inverter and an integrated charging control unit (ICCU).

Therefore, the controller 40 receives an input related to whether to heat the battery 11. When the battery 11 is required to be heated, the controller 40 allows the drive motor 21a to generate heat by applying a preset electric current to the drive motor 21a. In this case, the preset electric current has an electric current value that allows the drive motor 21a to generate heat in a state in which the drive motor 21a is restricted. An electric current is applied, in a reverse direction, to some coils of a stator at the time of applying the electric current to the coils of the stator that constitutes the drive motor 21a, such that the coil may generate heat while a rotor does not rotate. The direction and amount of the preset electric current applied to the plurality of coils may be adjusted depending on a traveling or stationary situation of the mobility vehicle. The amount of electric current may be adjusted depending on the amount of heat generated from the coil.

As described above, when the controller 40 applies the preset electric current to the drive motor 21a, the drive motor 21a generates heat, the drive motor 21a is cooled by the oil cooler 21b, and the coolant in the second coolant line 20 is heated. As described above, when the coolant in the second coolant line 20 is heated, the coolant in the second coolant line 20 exchanges heat with the coolant in the first coolant line 10 through the heat exchanger 30, such that the coolant in the first coolant line 10 is heated. The heated coolant exchanges heat with the battery 11, such that the battery 11 is heated.

As described above, according to embodiments of the present invention, the heat generated from the drive motor 21a is used to heat the battery 11, the temperature of the battery 11 may be adjusted and the time required to heat the battery 11 may be reduced even though the coolant heater in the related art is eliminated. In addition, the coolant heater is eliminated, and the drive motor 21a basically provided in the electric mobility vehicle is used, such that the manufacturing costs and weight are reduced.

The controller 40 according to embodiments of the present invention is controlled as follows.

The controller 40 may raise the temperature of the coolant in the first coolant line 10 by applying the preset electric current to the drive motor 21*a* until the temperature of the battery 11 reaches an appropriate temperature. In this case, the appropriate temperature is a temperature for optimizing the battery 11 when the battery 11 produces an output or is charged.

When the controller 40 applies the preset electric current to the drive motor 21*a* to heat the battery 11, the heat generated from the drive motor 21*a* is transferred to the coolant that circulates in the second coolant line 20 through the oil cooler 21*b*, and the coolant in the second coolant line 20 and the coolant in the first coolant line 10 exchange heat with each other through the heat exchanger 30, such that the coolant in the first coolant line 10 is heated and circulates through the battery 11. Therefore, the battery 11 may be heated. When the temperature of the battery 11 reaches an appropriate temperature, the controller 40 cuts off the application of the preset electric current to the drive motor 21*a*, thereby maintaining the appropriate temperature of the battery 11, preventing electric power consumption, and preventing damage caused by excessive heat dissipation from the drive motor 21*a*.

Meanwhile, when the temperature of the drive motor 21*a* reaches the preset limit temperature, the controller 40 cuts off the application of the preset electric current for heating the battery 11. In this case, the limit temperature is a temperature at which the component may be damaged as the drive motor 21*a* is overheated. The controller adjusts the temperature so that the temperature of the drive motor 21*a* does not reach the limit temperature.

That is, the controller 40 receives information on the temperature of the drive motor 21*a* from a sensor. In case that the inputted temperature of the drive motor 21*a* reaches the limit temperature, the controller 40 cuts off the application of the preset electric current, thereby preventing damage to the drive motor 21*a*.

Meanwhile, the controller 40 identifies a plan to charge the mobility vehicle when the mobility vehicle travels. Before the mobility vehicle reaches a location at which the mobility vehicle may be charged, the controller 40 applies the preset electric current to the drive motor 21*a* to allow the drive motor 21*a* to generate heat.

The controller 40 may receive traveling information from a navigation system and identify whether to set a destination for charging the mobility vehicle. In this case, when the destination for charging the mobility vehicle is set and the mobility vehicle travels, the controller 40 collects information on a distance to the corresponding destination and information on the temperature of the battery 11. When the temperature of the battery 11 is lower than the appropriate temperature before the mobility vehicle reaches the destination, the controller 40 allows the drive motor 21*a* to generate heat by applying the preset electric current to the drive motor 21*a*.

For example, when the temperature of the battery 11 is lower than the appropriate temperature in a state in which a remaining distance from a current position of the mobility vehicle to a destination, which is the location at which the mobility vehicle may be charged, is equal to or shorter than a preset distance, the controller 40 allows the drive motor 21*a* to generate heat by applying the preset electric current to the drive motor 21*a*. Therefore, because the battery 11 is heated by the heat generated from the drive motor 21*a*, the deterioration in charging efficiency caused by a decrease in temperature of the battery 11 is prevented when the mobility vehicle reaches the destination and the battery 11 is charged, which makes it possible to ensure charging performance and a charging speed.

Meanwhile, the drive motor 21*a* is provided as a plurality of drive motors 21*a*, and the oil coolers 21*b* are respectively provided in the drive motors 21*a*.

For example, the drive motors 21*a* may include a front wheel drive motor and a rear wheel drive motor. A front wheel oil cooler for cooling the front wheel drive motor may be provided, and a rear wheel oil cooler for cooling the rear wheel drive motor may be provided. Therefore, when a front wheel of the mobility vehicle operates, only the front wheel drive motor operates, and the rear wheel drive motor does not operate. When a rear wheel of the mobility vehicle operates, only the rear wheel drive motor operates, and the front wheel drive motor does not operate.

Therefore, in case that the mobility vehicle travels, the controller 40 applies the preset electric current to the drive motor 21*a*, which does not operate among the plurality of drive motors 21*a*, to allow the drive motor 21*a* to generate heat. For example, in case that the front wheel of the mobility vehicle operates, the front wheel drive motor normally operates, the coolant in the second coolant line is heated by the cooling operation performed by the front wheel oil cooler, and the preset electric current is applied to the rear wheel drive motor that does not operate, such that the rear wheel drive motor generates heat, and the coolant in the second coolant line is heated by the rear wheel oil cooler.

Therefore, the coolant circulating in the second coolant line 20 may be heated by the heat generated from the front wheel drive motor and the heat generated from the rear wheel drive motor and may exchange heat with the coolant in the first coolant line 10 through the heat exchanger 30, such that the temperature of the coolant of the first coolant line 10 may be raised, and the battery 11 may be heated.

As described above, according to embodiments of the present invention, at the time of heating the battery 11, the preset electric current may be applied to the drive motor 21*a* that does not operate, and the drive motor 21*a*, which does not operate, may be heated, such that the battery 11 may be heated by the heat of the drive motor 21*a*.

Meanwhile, as illustrated in FIG. 3, the thermal management system for a mobility vehicle according to embodiments of the present invention includes a refrigerant circuit 50 including a compressor 51, condensers 52, an expander 53, and an evaporator 54 and configured to allow a refrigerant to circulate therethrough, the first coolant line 10 including the battery 11 and configured to allow the coolant to circulate therethrough, the second coolant line 20 including the electrical component 21 including the oil cooler 21*b* for cooling the drive motor 21*a*, the second coolant line 20 being configured to allow the coolant to circulate therethrough, the heat exchanger 30 connected to the refrigerant circuit 50, the first coolant line 10, and the second coolant line 20 and configured to allow the refrigerant and the coolants to exchange heat with one another, and the controller 40 configured to heat the coolant in the second coolant line 20 by the oil cooler 21*b* by allowing the drive motor 21*a* to generate heat by applying the preset electric current to the drive motor 21*a* and configured to raise the temperature of the battery 11 by allowing the coolant in the second coolant line 20 to exchange heat with the coolant of the first coolant line 10 through the heat exchanger 30 when the battery 11 is required to be heated.

As described above, according to embodiments of the present invention, the refrigerant circulating in the refrigerant circuit 50, the coolant circulating in the first coolant line 10, and the coolant circulating in the second coolant line 20 exchange heat with one another through the heat exchanger 30, such that the temperatures of the coolants may be adjusted.

In this case, the condensers 52 of the refrigerant circuit 50 include an internal condenser 52a and an external condenser 52b. The internal condenser 52a and the evaporator 54 may be disposed in an air conditioning casing and adjust a temperature of air conditioning air.

In addition, the refrigerant circuit 50 may further include a branch line 50a branching off from a front end of the evaporator 54, and the heat exchanger 30 may be provided in the branch line 50a. An additional expander 53a may be provided at a front end of the heat exchanger 30.

Therefore, the refrigerant passing through the compressor 51 and the condenser 52 is expanded by the expander 53 and moved to the evaporator 54, such that the evaporator 54 absorbs heat and cool air. Alternatively, the refrigerant is expanded by the additional expander 53a and moved to the heat exchanger 30, such that the heat exchanger 30 absorbs heat, and the coolant in the first coolant line 10 and the coolant in the second coolant line 20 are cooled.

Meanwhile, the first coolant line 10 and the second coolant line 20 are configured to allow the refrigerant and the coolants to exchange heat with one another through the heat exchanger 30, such that the temperatures of the coolants may be adjusted.

In this case, the first water pump 12 may be provided in the first coolant line 10, such that the coolant may be circulated in the first coolant line 10 by the operation of the first water pump 12. The second water pump 22 may be provided in the second coolant line 20, such that the coolant may be circulated in the second coolant line 20 by the operation of the second water pump 22.

In addition, the first coolant line may further include the first radiator 13, and the coolant may be divided by the first valve 14 and selectively flow to the first radiator 13. The second coolant line may further include the second radiator 23, and the coolant may be divided by the second valve 24 and selectively flow to the second radiator 23.

Therefore, according to embodiments of the present invention, the temperature of the refrigerant in the refrigerant circuit 50 is adjusted, the temperatures of the coolants in the coolant lines are adjusted, and the heat exchange is performed, such that the temperatures required for the components including the battery 11 and the electrical component 21 may be satisfied, and the heat pump may be implemented.

Meanwhile, according to embodiments of the present invention, the controller 40 receives an input related to whether to heat the battery 11. When the battery 11 is required to be heated, the controller 40 allows the drive motor 21a to generate heat by applying a preset electric current to the drive motor 21a. In this case, the preset electric current has an electric current value that allows the drive motor 21a to generate heat in a state in which the drive motor 21a is restricted. An electric current is applied, in a reverse direction, to some coils of a stator at the time of applying the electric current to the coils of the stator that constitutes the drive motor 21a, such that the coils may generate heat while a rotor does not rotate.

As described above, when the controller 40 applies the preset electric current to the drive motor 21a, the drive motor 21a generates heat, the drive motor 21a is cooled by the oil cooler 21b, and the coolant in the second coolant line 20 is heated. As described above, when the coolant in the second coolant line 20 is heated, the coolant in the second coolant line 20 exchanges heat with the coolant in the first coolant line 10 through the heat exchanger 30, such that the coolant in the first coolant line 10 is heated. The heated coolant exchanges heat with the battery 11, such that the battery 11 may be heated.

Meanwhile, as illustrated in FIG. 4, when the battery 11 is required to be heated, the controller 40 may supply the high-temperature refrigerant, which passes through the condenser 52 of the refrigerant circuit 50, to the heat exchanger 30, such that the coolant in the first coolant line 10 may be heated by exchanging heat with the refrigerant.

As described above, when the battery 11 is required to be heated, the coolant in the first coolant line 10 exchanges heat with the refrigerant in the refrigerant circuit 50 to raise the temperature of the coolant in the first coolant line 10. That is, the high-temperature refrigerant passing through the compressor 51 and the condenser 52 flows to the heat exchanger 30, such that the coolant in the first coolant line 10 may be heated as the coolant in the first coolant line 10 exchanges heat with the refrigerant in the heat exchanger 30.

Therefore, the battery 11 provided in the first coolant line 10 may be heated by the coolant having the temperature raised as the coolant exchanges heat with the refrigerant.

The thermal management system for a mobility vehicle, which is structured as described above, adjusts the temperature of the coolant, which circulates through the battery 11, by using the heat generated from the drive motor 21a applied to the electric mobility vehicle.

Therefore, the temperature of the battery 11 may be adjusted even though the coolant heater is eliminated. The time required to heat the battery 11 may be reduced, the temperature of the battery 11 may be stably adjusted, and the manufacturing costs and weight may be reduced because the devices applied to the electric mobility vehicle are used.

While the specific embodiments of the present invention have been illustrated and described, it will be obvious to those skilled in the art that the present invention may be variously modified and changed without departing from the technical spirit of the present invention defined in the appended claims.

What is claimed is:

1. A thermal management system for a mobility vehicle, the thermal management system comprising:
   a first coolant line comprising a battery;
   a second coolant line comprising an electrical component comprising a plurality of oil coolers, wherein each oil cooler of the plurality of oil coolers is configured to cool a respective drive motor of a plurality of drive motors;
   a heat exchanger connected to the first coolant line and the second coolant line, wherein the heat exchanger is configured to allow a coolant in the first coolant line to exchange heat with the coolant in the second coolant line; and
   a controller configured to adjust a temperature of the battery as the coolant in the second coolant line is heated by the plurality of oil coolers by allowing a non-operating drive motor of the plurality of drive motors to generate heat by applying a preset electric current to the non-operating drive motor when the mobility vehicle travels and as the coolant in the first coolant line is heated by heat exchange with the coolant in the second coolant line in the heat exchanger when the battery is required to be heated.

2. The thermal management system of claim 1, wherein the preset electric current has an electric current value that allows the non-operating drive motor to generate heat in a state in which the non-operating drive motor is restricted.

3. The thermal management system of claim 1, wherein the controller is configured to raise the temperature of the coolant in the first coolant line by applying the preset electric current to the non-operating drive motor until the temperature of the battery reaches an appropriate temperature.

4. The thermal management system of claim 1, wherein:
the first coolant line further comprises a first radiator; and
a first valve is configured to divide the coolant so that the coolant selectively flows to the first radiator.

5. The thermal management system of claim 1, wherein:
the second coolant line further comprises a second radiator; and
a second valve is configured to divide the coolant so that the coolant selectively flows to the second radiator.

6. The thermal management system of claim 1, wherein the controller is configured to cut off application of the preset electric current for heating the battery when the temperature of the non-operating drive motor reaches a preset limit temperature.

7. The thermal management system of claim 1, wherein the controller is configured to:
identify a plan to charge the mobility vehicle when the mobility vehicle travels; and
allow the non-operating drive motor to generate heat by applying the preset electric current to the non-operating drive motor before the mobility vehicle reaches a location at which the mobility vehicle is to be charged.

8. The thermal management system of claim 1, wherein the controller is configured to:
collect information on a distance to a destination;
collect information on a temperature of the battery; and
wherein applying the preset electric current to the non-operating drive motor to generate heat is based on a determination that the temperature of the battery is lower than a predetermined temperature before the mobility vehicle reaches the destination.

9. A thermal management system for a mobility vehicle, the thermal management system comprising:
a first coolant line comprising a battery;
a second coolant line comprising an electrical component comprising a plurality of oil coolers, wherein each oil cooler of the plurality of oil coolers is configured to cool a respective drive motor of a plurality of drive motors;
a first water pump provided in the first coolant line;
a second water pump provided in the second coolant line;
a heat exchanger connected to the first coolant line and the second coolant line, wherein the heat exchanger is configured to allow a coolant in the first coolant line to exchange heat with the coolant in the second coolant line; and
a controller configured to adjust a temperature of the battery as the coolant in the second coolant line is heated by the plurality of oil coolers by allowing a non-operating drive motor of the plurality of drive motors to generate heat by applying a preset electric current to the non-operating drive motor when the mobility vehicle travels and as the coolant in the first coolant line is heated by heat exchange with the coolant in the second coolant line in the heat exchanger when the battery is required to be heated.

10. The method thermal management system of claim 9, wherein the controller is configured to cut off application of the preset electric current for heating the battery when the temperature of the non-operating drive motor reaches a preset limit temperature.

11. The thermal management system of claim 9, wherein the controller is configured to:
identify a plan to charge the mobility vehicle when the mobility vehicle travels; and
allow the non-operating drive motor to generate heat by applying the preset electric current to the non-operating drive motor before the mobility vehicle reaches a location at which the mobility vehicle is to be charged.

12. The thermal management system of claim 9, further comprising:
a first radiator provided in the first coolant line; and
a first valve configured to divide the coolant so that the coolant selectively flows to the first radiator.

13. The thermal management system of claim 12, further comprising:
a second radiator provided in the second coolant line; and
a second valve configured to divide the coolant so that the coolant selectively flows to the second radiator.

14. The thermal management system of claim 9, wherein the controller is configured to:
collect information on a distance to a destination;
collect information on a temperature of the battery; and
wherein applying the preset electric current to the non-operating drive motor to generate heat is based on a determination that the temperature of the battery is lower than a predetermined temperature before the mobility vehicle reaches the destination.

15. A method of operating a thermal management system that comprises a first coolant line comprising a battery, a second coolant line comprising an electrical component comprising a plurality of oil coolers, and a heat exchanger connected to the first coolant line and the second coolant line, the method comprising:
cooling a plurality of drive motors of a mobility vehicle with the plurality of oil coolers, wherein each oil cooler of the plurality of oil coolers is configured to cool a respective drive motor of the plurality of drive motors;
using the heat exchanger to allow a coolant in the first coolant line to exchange heat with the coolant in the second coolant line; and
adjusting a temperature of the battery as the coolant in the second coolant line is heated by the plurality of oil coolers by allowing a non-operating drive motor of the plurality of drive motors to generate heat by applying a preset electric current to the non-operating drive motor when the mobility vehicle travels and as the coolant in the first coolant line is heated by heat exchange with the coolant in the second coolant line in the heat exchanger when the battery is required to be heated.

16. The method of claim 15, wherein the preset electric current has an electric current value that allows the non-operating drive motor to generate heat in a state in which the non-operating drive motor is restricted.

17. The method of claim 15, further comprising raising the temperature of the coolant in the first coolant line by applying the preset electric current to the non-operating drive motor until the temperature of the battery reaches an appropriate temperature.

18. The method of claim 15, further comprising cutting off application of the preset electric current when the temperature of the non-operating drive motor reaches a preset limit temperature.

19. The method of claim 15, further comprising:

identifying a plan to charge the mobility vehicle when the mobility vehicle travels; and allowing the non-operating drive motor to generate heat by applying the preset electric current to the non-operating drive motor before the mobility vehicle reaches a location at which the mobility vehicle is to be charged.

20. The method of claim 15, the method further comprising:

collecting information on a distance to a destination;

collecting information on a temperature of the battery; and wherein applying the preset electric current to the non-operating drive motor to generate heat is based on a determination that the temperature of the battery is lower than a predetermined temperature before the mobility vehicle reaches the destination.

\* \* \* \* \*